(12) United States Patent
Tsuda

(10) Patent No.: US 8,230,563 B2
(45) Date of Patent: Jul. 31, 2012

(54) METHOD OF MANUFACTURING A PIEZOELECTRIC COMPONENT

(75) Inventor: Toshimasa Tsuda, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 448 days.

(21) Appl. No.: 12/459,370

(22) Filed: Jun. 30, 2009

(65) Prior Publication Data

US 2010/0019867 A1    Jan. 28, 2010

(30) Foreign Application Priority Data

Jul. 23, 2008    (JP) ................ 2008-189771

(51) Int. Cl.
*H04R 17/10* (2006.01)
*H05K 3/36* (2006.01)

(52) U.S. Cl. ............. 29/25.35; 29/842; 29/852; 29/832; 29/417; 333/193; 310/313 B; 310/349; 310/365

(58) Field of Classification Search ............... 29/25.35, 29/594, 842, 846, 832, 852, 412, 417, 830; 333/193; 310/313 R, 313 B, 348, 349, 365
See application file for complete search history.

(56) References Cited

U.S. PATENT DOCUMENTS 7,389,570 B2 * 6/2008 Yokota et al. ............ 29/25.35

FOREIGN PATENT DOCUMENTS

| JP | 11-067830 | | 3/1999 |
|---|---|---|---|
| JP | 2001-156585 | | 6/2001 |
| JP | 2003158436 A | * | 5/2003 |
| JP | 2004-147220 | | 5/2004 |
| JP | 2006-246112 | | 9/2006 |
| JP | 2007-067617 | | 3/2007 |
| JP | 2008-135971 | | 6/2008 |
| WO | WO 2007/083432 | | 7/2007 |

* cited by examiner

*Primary Examiner* — A. Dexter Tugbang
(74) *Attorney, Agent, or Firm* — Scott D. Wofsy; Edwards Wildman Palmer LLP

(57) ABSTRACT

A method for forming a piezoelectric component includes forming a plurality of sets of first piezoelectric elements having comb-shaped electrodes and wiring electrodes on a principal surface of a piezoelectric substrate base material, forming a protective film, a seed layer, and terminal electrodes, and removing the seed layer by etching. The method further includes preparing another piezoelectric substrate and performing resin-sealing by laminating a photosensitive resin film onto a principal surface side of the piezoelectric substrate base material. Cu electroplating is performed upon the terminal electrodes, and the piezoelectric substrate base material is cut along dicing lines to obtain individual piezoelectric components. The piezoelectric component includes a first piezoelectric element and a plurality of second piezoelectric elements with the second piezoelectric elements sealed by a resin seal layer such that a hollow section is formed between opposing principal surfaces thereof.

4 Claims, 3 Drawing Sheets

Manufacturing Process of Piezoelectric Substrate Base Material

Manufacturing Process of Piezoelectric Element

METHOD OF MANUFACTURING A PIEZOELECTRIC COMPONENT

BACKGROUND OF THE INVENTION

1. Field of the Invention

The present invention relates to piezoelectric components such as a surface acoustic wave (SAW) device used in a SAW duplexer or SAW filter, or a piezoelectric thin film filter, that are used for example in mobile communication equipment such as mobile telephones, and a manufacturing method thereof, and relates, in particular, to a chip-size packaged piezoelectric component in which a piezoelectric element is flip-chip mounted on a wafer (piezoelectric substrate) at the wafer level, and a manufacturing method thereof.

2. Description of Related Art

In a piezoelectric component (SAW device) to be installed in a mobile phone or the like, a predetermined hollow section around the comb-shaped electrodes (IDT electrodes) thereof is required.

Conventionally, to reduce the size of a SAW device, a SAW element chip is flip-chip bonded (face-down bonded) to a wired substrate using gold (Au) bumps or solder bumps, and the entire SAW element chip is subjected to resin encapsulation by resin or the like to configure a small package size SAW device (refer to Japanese Unexamined Patent Publication No. 2004-147220).

In addition, to reduce the size and height of a SAW device, a microminiaturized chip size packaged SAW device is proposed in which a predetermined hollow section is formed around a comb-shaped electrode section (IDT electrode section), and while maintaining this hollow section, the entire integrated piezoelectric substrate (wafer) on the comb-shaped electrode side, is sealed by resin, external connection electrodes are formed, and then the wafer is divided into individual SAW devices by dicing along predetermined markings (refer to Japanese Unexamined Patent Publication No. 2006-246112).

However, with the piezoelectric components and manufacturing methods thereof described in the related art above, piezoelectric elements are formed upon a two-dimensional flat surface (principal surface) of the piezoelectric substrate. Therefore, because when the size of the piezoelectric component (SAW device) is reduced, with this reduction in size the active face (functional surface) of the piezoelectric element is also reduced in size, maintaining a desired level of performance while reducing size is extremely difficult.

Furthermore, in methods of manufacturing piezoelectric components by simply affixing piezoelectric substrates (wafers) to one another, through electrodes must be formed. However this requires the formation of through holes (via holes), and other steps including a plating step for filling the through holes to form the through electrodes, or a step for plugging the through holes. Furthermore, if the respective piezoelectric substrates are made of different materials, problems can occur such as the overall piezoelectric substrate undergoing "warping".

SUMMARY OF THE INVENTION

The problem to be solved by the invention is to manufacture a piezoelectric component (SAW device) suitable for small scale and high performance applications at low cost, by mounting prefabricated piezoelectric elements (SAW chips) face-down on a piezoelectric substrate (wafer) base material, electrically connecting the electrodes of the piezoelectric elements and the electrodes of the piezoelectric substrate base material by a reflow process, and performing resin sealing of the piezoelectric elements without heating to a high temperature by using a photosensitive resin sheet instead of epoxy resin, while simultaneously forming the through holes for through electrode formation.

To solve the above problem, a piezoelectric component of the present invention comprises: a first piezoelectric element composed of a piezoelectric substrate, comb-shaped electrodes formed on a principal surface of the piezoelectric substrate, and wiring electrodes having element wiring disposed adjacent to the comb-shaped electrodes; terminal electrodes formed on the piezoelectric substrate; and a plurality of second piezoelectric elements on the principal surfaces of which are formed solder electrodes which contact the terminal electrodes, and comb-shaped electrodes and wiring electrodes; wherein the second piezoelectric elements are sealed by a resin seal layer composed of a photosensitive resin sheet such that a hollow section is formed between the opposing principal surfaces of the first piezoelectric element and the second piezoelectric element, and comprise through electrodes which penetrate the resin seal layer and contact the terminal electrodes at their top end section.

Furthermore, in the same manner, a manufacturing method for a piezoelectric component of the present invention comprises: the steps for forming a plurality of sets of first piezoelectric elements comprising comb-shaped electrodes and wiring electrodes on a principal surface of a piezoelectric substrate base material; forming a protective film on a surface of the first piezoelectric element; forming a seed layer for terminal electrode formation on the principal surface; forming terminal electrodes upon the seed layer by Cu electroplating; removing the seed layer by etching; preparing another piezoelectric substrate, forming a plurality of sets of second piezoelectric elements composed of comb-shaped electrodes and wiring electrodes on a principal surface of the other piezoelectric substrate, forming solder electrodes adjacent to the comb-shaped electrodes and wiring electrodes on the principal surface, and then cutting by dicing to obtain individual second piezoelectric elements; installing the individual second piezoelectric elements face down on the principal surface of the piezoelectric substrate base material so that the solder electrodes contact the terminal electrodes provided on the principal surface of the piezoelectric substrate base material; connecting the solder electrodes and the terminal electrodes by a reflow process; performing resin-sealing by laminating a photosensitive resin film onto a principal surface side of the piezoelectric substrate base material while heating to a predetermined softening temperature or melting, so as to form a hermetic hollow section around the comb-shaped electrodes and the wiring electrodes; forming through holes for through electrode formation in the sealing resin layer by exposing, developing, and removing predetermined parts of the top surface of the resin-sealed photosensitive resin film by photolithography; performing Cu electroplating upon the terminal electrodes to fill the through holes and form through electrodes; and cutting by dicing the piezoelectric substrate base material along dicing lines to obtain individual piezoelectric components.

According to the present invention, the size of the piezoelectric component can be reduced and the number of piezoelectric elements increased, and because batch processing can be performed in piezoelectric substrate (wafer) units, a reduction in cost can be realized.

DETAILED DESCRIPTION OF THE PREFERRED EMBODIMENTS

Hereafter, the piezoelectric component of the present invention and manufacturing method thereof are described with reference to an embodiment of a SAW device.

Piezoelectric Component (SAW Device)

Figure 1:
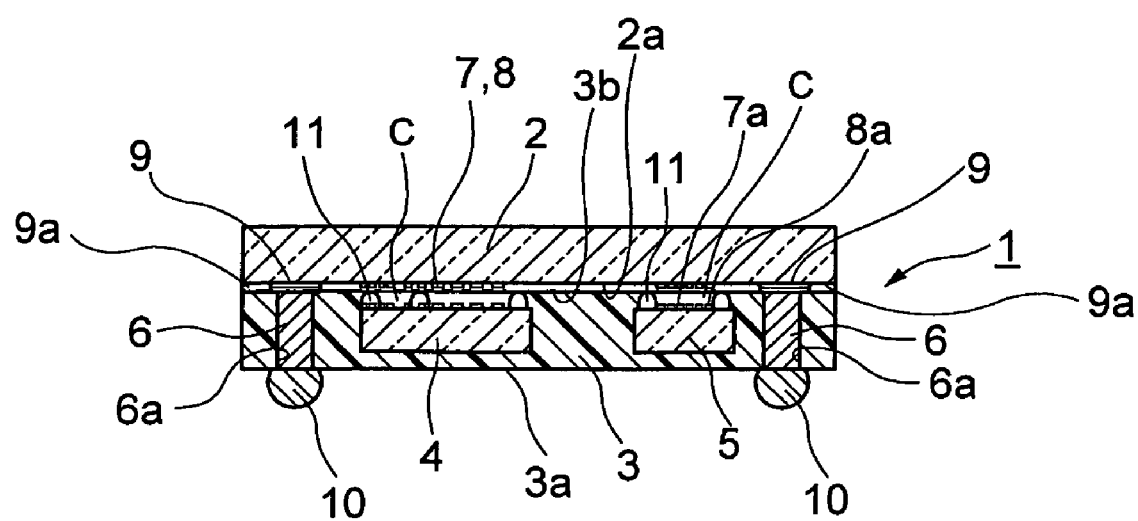
FIG. 1 is a vertical cross-section of a SAW device serving as an embodiment of the piezoelectric component of the present invention.

FIG. 1 shows a SAW device serving as an embodiment of the piezoelectric device of the present invention.

This SAW device 1, as shown in FIG. 1, comprises: a piezoelectric substrate 2 having piezoelectric properties such as lithium tantalite ($LiTaO_3$), lithium niobate ($LiNbO_3$), or quartz, or a piezoelectric substrate having piezoelectric functionality formed on a substrate; a first piezoelectric element comprising IDT electrodes 7 composed of aluminum film which are formed on a principal surface of this piezoelectric substrate 2 by vapor deposition or sputtering, and wiring electrodes 8 having element wiring; and a plurality of (for example, two) second piezoelectric elements (SAW elements) 4 and 5, similarly having IDT electrodes 7a and wiring electrodes 8a on a principal surface sealed within a sealing resin 3 composed of a photosensitive resin sheet, mounted on the principal surface of the piezoelectric substrate 2. Hermetic hollow sections C are formed around the IDT electrodes 7, 7a and the wiring electrodes 8, 8a between the principal surface 2a of the piezoelectric substrate 2 and the opposing principal surfaces of the piezoelectric elements 4 and 5. Here, the material of the piezoelectric elements 4 and 5 may be the same as the material of the piezoelectric substrate 2.

In addition, regarding the sealing resin 3, for example, opposing the four corners thereof, four through electrodes (electrode posts) 6 are formed by performing electroplating or the like inside through holes (via holes) 6a in the sealing electrodes 3, the top ends of the through electrodes 6 are electrically connected to the wiring electrodes 8, 8a via terminal electrodes 9 formed on the principal surface of the piezoelectric substrate 2, and the other end sections thereof are electrically connected to solder electrodes (bumps) 10. Furthermore, on the principal surfaces of the piezoelectric elements 4 and 5, a plurality of solder electrodes (bumps) 11 are provided, which are respectively electrically connected to the terminal electrodes 9 of the piezoelectric substrate 2. Moreover, the solder electrodes 10 are respectively connected to wiring electrodes (not shown in figure) on a mounting board.

Here, on the principal surface of the piezoelectric substrate 2, an insulating film 9a composed of $SiO_2$ is formed, so as to prevent leakage of the terminal electrode material reflowed during formation of the rewiring layers 9, and also enhance the durability of the IDT electrodes 7 and wiring electrodes 8 formed on the piezoelectric substrate 2.

Furthermore, on the piezoelectric substrate 2, electrodes composed of metal are formed, which are electrically connected to the solder electrodes 11 formed on the principal surfaces of the piezoelectric elements 4 and 5.

Moreover, the element wiring which forms the wiring electrodes 8, 8a is formed from a material having any one of Al, Cu, Au, Cr, Ru, Ni, Ti, W, V, Ta, Mo, Ag, In, and Sn as a main component, or from an alloy of these materials, or from multilayered wiring via an inorganic insulating film or an insulating film made of an organic material.

In addition, a plurality of element wires are formed upon the principal surface 2a of the piezoelectric substrate 2, and all of the element wires are wired so as to have the same potential, such that when the through electrodes 6 are formed by electroplating, the through electrodes 6 and the element wires can be electrically connected.

Furthermore, on a top surface 3b of the sealing resin 3, by; forming plated wiring, further disposing a photosensitive material with insulating properties and connecting with the terminal electrodes, forming the terminal electrodes again, and then forming electrodes from solder, a circuit using a distributed constant is formed.

In addition, the terminal electrodes 11 are metal bumps formed by metal ball bonding or plating, and the mounting of the piezoelectric elements 4 and 5 onto the piezoelectric substrate 2 is performed by a flip-chip or other method using ultrasonic thermo-compression bonding or thermo-compression bonding.

Still further, by using both surfaces of the piezoelectric substrate, or the principal surface side of the piezoelectric substrate, the through electrodes, and a rewiring layer or an insulating layer, or by forming wiring on the rear surface side of the piezoelectric substrate, a circuit using a distributed constant (stray capacitance, wiring length) is formed. Moreover a circuit which forms a resonant circuit in combination with impedance matching, phase shifting, or the IDT electrodes of the piezoelectric substrate is formed.

Piezoelectric Component Manufacturing Method

Next, a piezoelectric component manufacturing method of the present invention is described, with reference to a method of manufacturing a SAW device serving as an embodiment.

Figure 2:
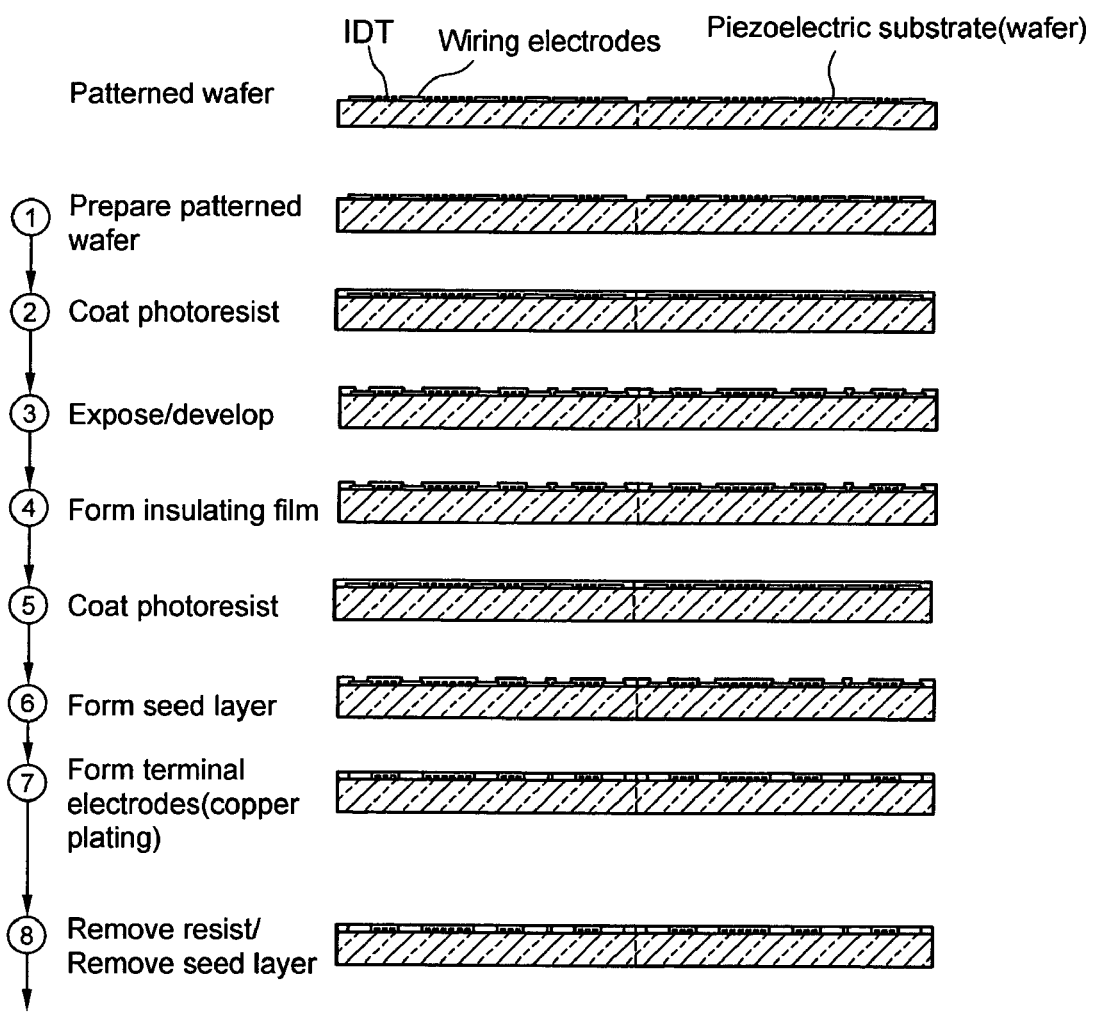
FIG. 2 shows the steps for forming a piezoelectric substrate base material (wafer) in a method of manufacturing a SAW device serving as an embodiment of the piezoelectric component of the present invention.

First, the manufacturing process of the piezoelectric substrate base material is described based on FIG. 2.

As shown in FIG. 2, in step (1), by performing vapor-deposition or sputtering on the principal surface of the patterned piezoelectric substrate (wafer), a so-called patterned wafer is prepared on which a metal film (for example an Al film) of a predetermined thickness (for example 2000 to 4000 Å) is formed.

Next, in step (2), a photosensitive resist is coated to the metal film, and in step (3), to form a plurality of groups (sets) of IDT electrodes and wiring electrodes, exposure and development are performed by photolithography so that the coated resist remains, and then by dry etching, the unnecessary metal film is removed, thereby forming the first piezoelectric element composed of IDT electrodes and wiring electrodes. The remaining resist is removed.

Furthermore, in step (4), on the surface of the formed IDT electrodes and wiring electrodes, as a protective film, by a technique such as sputtering, CVD (chemical vapor deposition), or PVD (physical vapor deposition), an insulating layer composed of an insulating material such as $SiO_2$ is formed. Subsequently, in step (5), a photosensitive photoresist is spin-coated onto this protective film, exposure and development are performed by photolithography to form a mask for etching the insulating material such as $SiO_2$, and then the unnecessary insulating material is removed by dry etching.

Next, after removing the photosensitive resist spin-coated in the previous step, in step (6), a seed layer for use in electroplating is formed on the principal surface of the piezoelectric substrate base material, by depositing a metal material such as Ti/W, Cr, Nc, or Cu using a deposition technique such as PVD.

Moreover, in step (7), terminal electrodes "a" are formed by Cu electroplating at electrode forming locations on the seed layer, and subsequently, in step (8) the remaining photosensitive resist is removed, and the seed layer is removed by etching. By these steps, the piezoelectric substrate (first piezoelectric element) base material 2 is manufactured.

Figure 3:
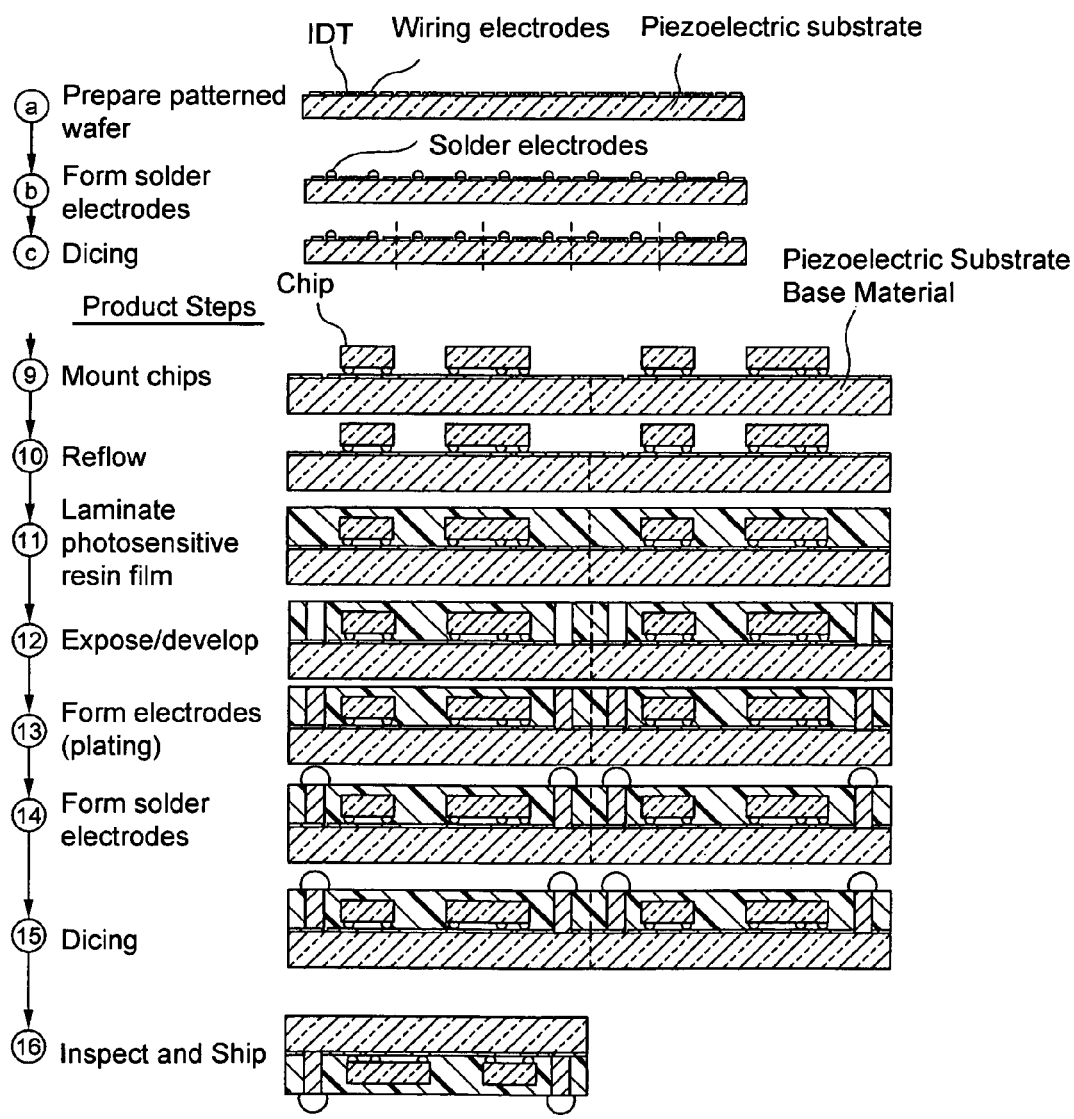
FIG. 3 shows the steps for forming second piezoelectric elements (SAW chips) and the steps for integrating the piezoelectric substrate base material (wafer) and the second piezoelectric elements (SAW chips) to manufacture the piezoelectric components (SAW devices), in a method of manufacturing a SAW device serving as an embodiment of the piezoelectric component of the present invention.

Next, based on FIG. 3, the manufacturing process of the second piezoelectric elements (SAW chips) installed on the principal surface of the piezoelectric substrate base material is described.

For these piezoelectric elements, in the same manner as the manufacturing process of the piezoelectric substrate base material described above, in step (a) shown in FIG. 3, a metal film (for example, an Al film) with a predetermined thickness is formed on a principal surface of a patterned piezoelectric substrate (wafer) by vapor deposition or sputtering, a photosensitive resist coated to the metal film is exposed and developed by photolithography, and the unnecessary metal film is then removed by dry etching, to prepare a so-called patterned wafer on which second piezoelectric elements composed of IDT electrodes and wiring electrodes are formed.

Next, in step (b), solder electrodes 11 which function as bumps are formed by electroplating with Sn as a main component, at predetermined locations on the piezoelectric substrate. Here, the solder electrodes may be formed by electroplating with a Au: 80%, Sn: 20% composition, or by forming Ni and Au plating on the principal surface of the piezoelectric substrate by Zi substitution, and then forming the solder electrodes thereon.

Finally, in step (c), the photosensitive resist remaining on the principal surface of the piezoelectric substrate is removed, and the piezoelectric substrate is divided into individual second piezoelectric elements by dicing along the dicing lines indicated by the dashed lines in FIG. 3.

Next, the process for installing these second piezoelectric elements on the principal surface of the piezoelectric substrate base material (first piezoelectric element) manufactured by the process shown in FIG. 2 is described.

As shown by steps (9) to (16) in FIG. 3, first the piezoelectric substrate base material manufactured in the preceding piezoelectric substrate base material manufacturing steps (steps (1) to (8)) is prepared, and the second piezoelectric elements (SAW chips) which are divided into individual chips in the preceding step (c) are inverted and flip-chip mounted in a face down configuration onto the terminal electrodes formed on the principal surface of the piezoelectric substrate base material. (Step (9)). At this time, a flip-chip mounter or a die bonder with an inverting feature may be used.

Next, by a reflow process performed in a reducing atmosphere of formic acid or hydrogen or the like, an inert gas atmosphere of nitrogen or the like, or in a vacuum, the solder electrodes 11 formed on the principal surfaces of the second piezoelectric elements, and the terminal electrodes "a" formed on the principal surface of the piezoelectric substrate base material (step (10)), are connected. By this soldering technique, soldering of both electrodes can be performed in a fluxless manner without leaving residue, and consequently cleaning is not required.

Furthermore, while heating a photosensitive resin film (photosensitive polyamide resin, photosensitive epoxy resin or the like) to a predetermined softening temperature (60 to 80° C.) or melting, the photosensitive resin film is laminated (affixed) to the principal surface side of the piezoelectric substrate base material by a roller or the like, thereby producing a resin seal which forms a hermetic hollow section "C" around the IDT electrodes and the wiring electrodes (step (11)). At this time, by adjusting the affixing temperature (softening temperature) and affixing pressure (5 kgf/mm$^2$), the photosensitive resin film can be laminated on the principal surface of the piezoelectric substrate base material 2 in such a state that the photosensitive resin film does not flow into the hollow section between the soldered second piezoelectric elements (SAW chips) 4 and 5 and the piezoelectric substrate base material 2, so that the hermetic hollow sections C are formed therebetween.

Next, after the photosensitive resin film used as the resin seal is temporarily cured, exposure and development of the regions which become the through electrodes of the piezoelectric components is performed by photolithography, and the applicable regions of the resin seal are removed by a combination of an excimer laser, dry etching, and wet etching, thereby forming the through holes (via holes) 6a for the through electrodes (step (12)). By these steps, the resin seal and the through holes for the through electrodes can be formed by a single process. Subsequently, the sealing resin is permanently cured.

Moreover, instead of the photosensitive resin film, other resins (for example epoxy resin sheets) may be used as the resin seal, and in this case, a technique such as pressure pressing or molding is used to form the through holes while leaving the hollow sections.

In addition, in step (7), by using a technique such as Cu electroplating upon the terminal electrodes formed by copper plating, the through holes 6a are filled to form the through electrodes 6 to substantially the same height as the top surface of the photosensitive resin used as the resin seal (step (13)). At this time, the through electrodes are formed by plating in the through holes, filling with molten solder, filling with a conductive paste, or by plugging, heating, and melting a nanopaste. In addition, using a photosensitive resin, a circuit pattern is formed upon the principal surface formed from a photosensitive resin film, thereby forming the distributed constant circuit or the like.

Then, on the top end surface of the through electrodes, by a technique such as printing and reflowing a solder paste, the solder electrodes 10 are formed (step (14)).

Finally, the piezoelectric substrate base material (wafer) is cut by dicing along the dicing lines, to obtain individual piezoelectric components (SAW devices) 1 (step (15)).

After inspection, the product (piezoelectric component) is shipped (step (16)).

The piezoelectric component and manufacturing method thereof of the present invention can be widely applied to piezoelectric elements and components for which extremely high reliability and performance are demanded, such as SAW devices, piezoelectric thin film filters, FBARs, and MEMSs, and their manufacture.

What is claimed is:

1. A manufacturing method for a piezoelectric component comprising:
   forming a plurality of sets of first piezoelectric elements comprising comb-shaped electrodes and wiring electrodes on a principal surface of a piezoelectric substrate base material;
   forming a protective film on a surface of the first piezoelectric elements;
   forming a seed layer for terminal electrode formation on said principal surface;
   forming terminal electrodes upon the seed layer by Cu electroplating;

removing said seed layer by etching;

preparing another piezoelectric substrate, forming a plurality of sets of second piezoelectric elements composed of comb-shaped electrodes and wiring electrodes on a principal surface of the another piezoelectric substrate, forming solder electrodes adjacent to the comb-shaped electrodes and wiring electrodes on the principal surface of the another piezoelectric substrate, and then cutting by dicing to obtain individual second piezoelectric elements;

installing said individual second piezoelectric elements face down on the principal surface of said piezoelectric substrate base material so that said solder electrodes contact said terminal electrodes provided on the principal surface of said piezoelectric substrate base material;

connecting said solder electrodes and said terminal electrodes by a reflow process;

performing resin-sealing by laminating a photosensitive resin film onto a principal surface side of said piezoelectric substrate base material while heating to a predetermined softening temperature or melting, so as to form a hermetic hollow section around said comb-shaped electrodes and said wiring electrodes;

forming through holes for through electrode formation in the sealing resin layer by exposing, developing, and removing predetermined parts of a top surface of the resin-sealed photosensitive resin film by photolithography;

performing Cu electroplating upon said terminal electrodes to fill said through holes and form through electrodes; and cutting by dicing said piezoelectric substrate base material along dicing lines to obtain individual piezoelectric components.

2. A manufacturing method for a piezoelectric component according to claim 1, further comprising a step for forming solder electrodes on bottom end sections of said through electrodes.

3. A manufacturing method for a piezoelectric component according to claim 1, wherein said step for connecting said solder electrodes and said terminal electrodes by a reflow process is performed in a reducing atmosphere of either formic acid or hydrogen, an inert gas atmosphere of nitrogen, or in a vacuum.

4. A manufacturing method for a piezoelectric component according to claim 1, wherein formation of said through holes is performed by a combination of an excimer laser, dry etching, and wet etching.

* * * * *